US011015758B2

(12) United States Patent
Espersen et al.

(10) Patent No.: US 11,015,758 B2
(45) Date of Patent: May 25, 2021

(54) GIMBAL RADIAL COUNTERBALANCE SYSTEMS AND METHODS

(71) Applicant: FLIR Surveillance, Inc., Wilsonville, OR (US)

(72) Inventors: Adam C. Espersen, Portland, OR (US); Charles Rush, Portland, OR (US)

(73) Assignee: FLIR Surveillance, Inc., Wilsonville, OR (US)

( * ) Notice: Subject to any disclaimer, the term of this patent is extended or adjusted under 35 U.S.C. 154(b) by 373 days.

(21) Appl. No.: 16/240,384

(22) Filed: Jan. 4, 2019

(65) Prior Publication Data

US 2019/0219221 A1 Jul. 18, 2019

Related U.S. Application Data

(60) Provisional application No. 62/616,939, filed on Jan. 12, 2018.

(51) Int. Cl.
*F16M 11/12* (2006.01)
*G05D 1/02* (2020.01)
*H03K 19/173* (2006.01)

(52) U.S. Cl.
CPC ......... *F16M 11/123* (2013.01); *G05D 1/0202* (2013.01); *H03K 19/1733* (2013.01)

(58) Field of Classification Search
CPC . F16M 11/123; G05D 1/0202; H03K 19/1733
See application file for complete search history.

(56) References Cited

U.S. PATENT DOCUMENTS

| 5,897,223 A | 4/1999 | Tritchew et al. |
| 2014/0288694 A1* | 9/2014 | Wagner ................. G03B 17/561 700/213 |
| 2016/0014309 A1* | 1/2016 | Ellison .................... F16C 11/04 248/550 |

* cited by examiner

*Primary Examiner* — Tyler J Lee
*Assistant Examiner* — Yufeng Zhang
(74) *Attorney, Agent, or Firm* — Haynes and Boone, LLP

(57) ABSTRACT

Radial counterbalance mechanisms and related techniques are provided to improve the accuracy and reliability of gimbal systems. A radial counterbalance system includes a radial counterbalance mechanism, an orientation sensor, and a logic device. The radial counterbalance mechanism includes a counterbalance weight and a motor configured to adjust a radial position of the counterbalance weight. The orientation sensor is configured to provide an orientation of a payload coupled to the gimbal ring, a platform coupled to the gimbal ring, and/or the gimbal ring. The logic device is configured to determine a compensating radial weight position for the counterbalance weight based, at least in part, on a received orientation, and to control the motor to position the counterbalance weight at the compensating radial weight position. The compensating radial weight position is configured to reduce a radial displacement of a center of gravity of the payload from the rotational axis of the gimbal ring.

20 Claims, 7 Drawing Sheets

GIMBAL RADIAL COUNTERBALANCE SYSTEMS AND METHODS

CROSS REFERENCE TO RELATED APPLICATIONS

This application claims the benefit of and priority to U.S. Provisional Patent Application No. 62/616,939 filed Jan. 12, 2018 and entitled "GIMBAL RADIAL COUNTERBALANCE SYSTEMS AND METHODS," which is incorporated herein by reference in its entirety

TECHNICAL FIELD

The present invention relates generally to gimbal control and, more particularly, to radial counterbalance mechanisms for use with gimbal systems.

BACKGROUND

Articulated sensors have long been used to monitor relatively broad sensor areas when it is not feasible or convenient to monitor such areas using an array of fixed sensors. For example, articulated sensors can be reoriented or swept through various orientations relative to a monitored area to gather a broad range of sensor data efficiently. Moreover, similar mounting mechanisms and techniques, such as actuated gimbal systems, are often used to couple sensors to mobile platforms so as to allow such sensors to be reoriented to compensate for motion of the mobile platform, for example, or to focus on a particular target or area that may be moving relative to the mobile platform.

When a conventional articulated sensor system is reoriented or accelerated, its center of gravity can change fairly substantially relative to the gimbal system being used to manipulate the orientation of the sensor system. Changes in the relative position of the center of gravity of the sensor system can cause orientation errors in the operation of the gimbal system, and such orientation errors can result in relatively poor sensor performance, particularly for applications including long range or narrow aperture imaging (e.g., 1000s of feet or more between the imager and the area being imaged, or magnified imaging), where the orientation errors can result in various forms of image jitter and misalignment, particularly as a mobile platform is in motion. Thus, there is a need in the art for methodologies to reliably reduce the risk and/or cause of such orientation errors.

SUMMARY

Radial counterbalance mechanisms and related techniques are provided to improve the accuracy and reliability of gimbal systems. One or more embodiments of the described radial counterbalance mechanisms may advantageously include a radially adjustable counterbalance weight, a motor to adjust the radial position of the counterbalance weight relative to a rotational axis of an associated gimbal system, one or more sensors configured to provide an orientation of the weight, the gimbal system, an associated sensor system or payload, and/or a coupled platform, and a controller to control the motor to position the counterbalance weight. For example, such sensors may include an orientation sensor, a gyroscope, an accelerometer, and/or a position sensor providing operational status of the counterbalance weight, the gimbal system, the sensor system or payload, and/or the coupled platform. The sensor system may include one or more visible and/or infrared spectrum cameras, for example, and/or other types of generally directional sensor systems. The platform may generally be a flight platform (e.g., a manned aircraft, a UAS, and/or other flight platform), a terrestrial platform (e.g., a fix structure or a motor vehicle), or a sea born platform (e.g., watercraft).

In one embodiment, a system includes a radial counterbalance mechanism, an orientation sensor, and a logic device configured to communicate with the radial counterbalance mechanism and the orientation sensor. The radial counterbalance mechanism may include a counterbalance weight and a motor configured to adjust a radial position of the counterbalance weight relative to a rotational axis of a gimbal ring. The orientation sensor may be configured to provide an orientation of a payload coupled to the gimbal ring, a platform coupled to the gimbal ring, and/or the gimbal ring. The logic device may be configured to receive the orientation of the payload, the platform, and/or the gimbal ring, determine a compensating radial weight position for the counterbalance weight based, at least in part, on the received orientation, and control the motor to position the counterbalance weight at the compensating radial weight position. The compensating radial weight position may be configured to reduce a radial displacement of a center of gravity of the payload from the rotational axis of the gimbal ring.

In another embodiment, a method includes receiving an orientation of a payload coupled to a gimbal ring, a platform coupled to the gimbal ring, and/or the gimbal ring; determining a compensating radial weight position for a counterbalance weight of a radial counterbalance mechanism based, at least in part, on the received orientation, and controlling a motor of the radial counterbalance mechanism to position the counterbalance weight at the compensating radial weight position. The compensating radial weight position may be configured to reduce a radial displacement of a center of gravity of the payload from a rotational axis of the gimbal ring.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
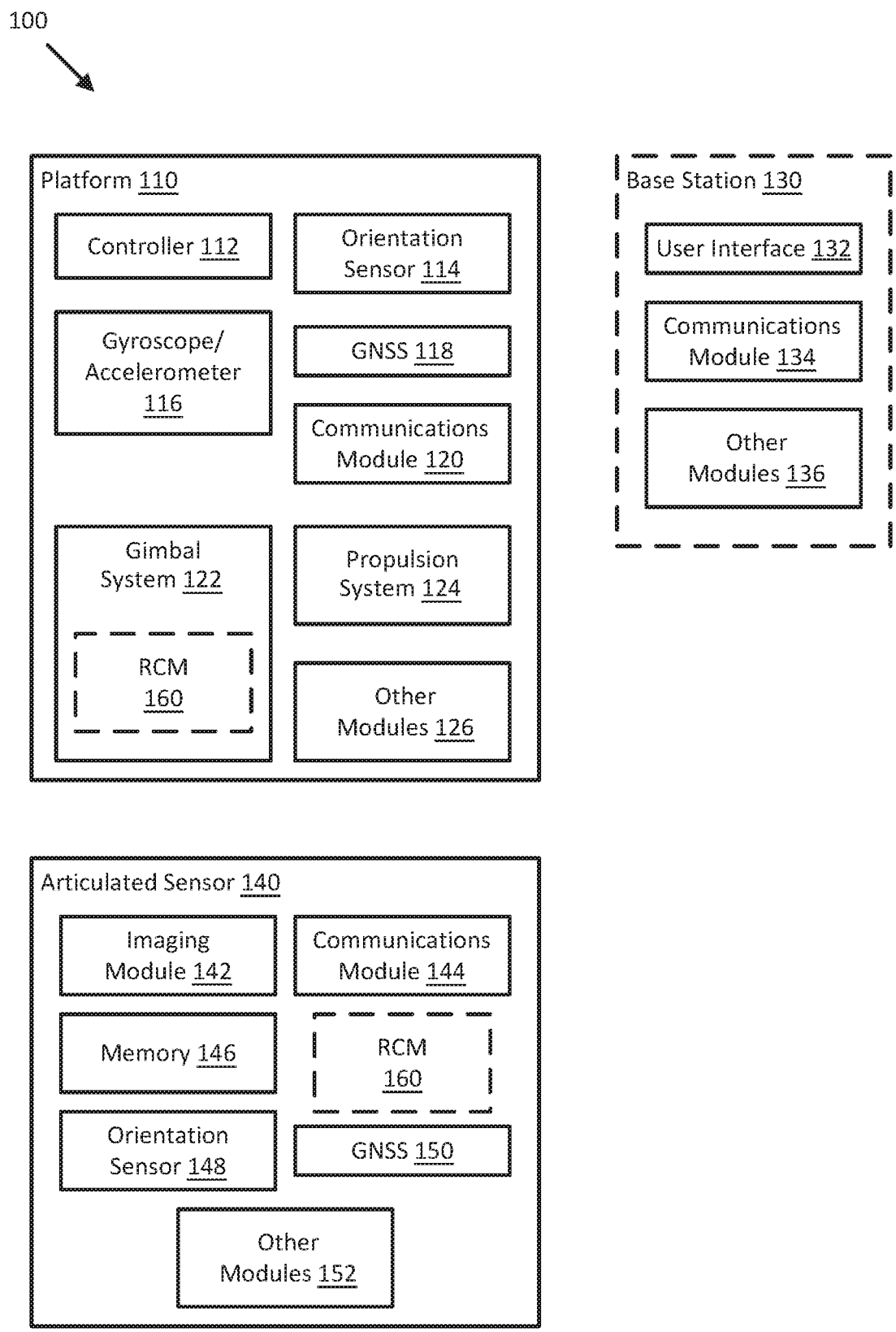
FIG. 1 illustrates a diagram of an articulated sensor/payload system including a gimbal system and a radial counterbalance mechanism in accordance with an embodiment of the disclosure.

Radial counterbalance mechanisms and related techniques are provided to improve the accuracy and reliability of gimbal systems and associated articulated sensor systems (e.g., sensor systems that are actuated and controllable to adjust an orientation of the sensor system) and/or other articulated payloads. A radial counterbalance mechanism may advantageously include a radially adjustable counterbalance weight, a motor to adjust the radial position of the counterbalance weight relative to a rotational axis of an associated gimbal system, one or more sensors configured to provide an orientation of the counterbalance weight, the gimbal system, an associated sensor system or other payload, and/or a coupled platform, and a controller to control the motor to position the counterbalance weight. Such sensors may include an orientation sensor, a gyroscope, an accelerometer, and/or a position sensor providing an operational status of the counterbalance weight, the gimbal system, the sensor system or payload, and/or the coupled platform, as described herein. The gimbaled payload may include one or more visible and/or infrared spectrum cameras, for example, a laser targeting system, and/or other types of generally directional sensor systems. The platform may be a flight platform (e.g., a manned aircraft, a UAS, and/or other flight platform), a terrestrial platform (e.g., a motor vehicle, or a fixed structure), or a sea born platform (e.g., watercraft, buoys, and sea platforms).

Various embodiments provide a radial counterbalance mechanism to correct imbalances in an articulated payload system caused by structural deflections that shift the system's center of gravity away from the designed-for rotational axis (e.g., typically corresponding to a gimbal ring bearing axis). For example, such deflections may be on the order of thousandths of an inch. As the gimbal or the platform rotates and the relative direction of gravity or other acceleration loadings changes, compensation is desirable to reduce or eliminate the imbalances, so as to mitigate collateral orientation errors caused by the imbalances and/or vibrational loadings. Such orientation errors may result in various forms of sensor operation degradation, including jitter or generally misalignment of image date generated by articulated imaging systems, both of which act to reduce overall range performance. By selecting a particular counterbalance mass and displacement length/pattern combination, a relatively simple rotary motor may be used to provide such compensation.

For example, articulated (e.g., gimballed) imaging systems often have complex structures supporting their payload and allowing rotation about multiple axes. Keeping the center of gravity aligned with the axes of rotation reduces torque loading on the gimbal system, which provides more stability under vibration or acceleration loading. In particular, as a gimbal rotates in elevation (e.g., pitch), the direction of gravity with respect to the payload changes. Deflection or flex of the payload's support structure shifts the center of gravity out of alignment with the pivot axis and is perceived as an imbalance. Embodiments of the disclosed radial counterbalance mechanism provide a radially positionable counterbalance weight that is designed to match the imbalances caused by deflections of the support structure and the mass of the payload. Embodiments can include a cam slot or other variable position mechanism to compensate for asymmetry of the support structure, where deflection is not uniform about a 360 degree rotation. Advantageously, embodiments may be implemented with a single motor and mechanism to translate motor motion into an appropriate compensating position for the counterbalance weight, which helps simplify the system and make it more compact and inexpensive to implement. The positioning of the counterbalance weight may be controlled through a feedback or servomechanism arrangement that accounts for the relative orientations of the loading, the payload, and the counterbalance weight, as described herein.

In general, the counterbalance weight may be controllably positioned to counterbalance the deflection of the center of gravity of the payload caused by structural deflections experienced under gravitational and/or other acceleration loading. In embodiments where only gravitational loading is compensated for, the direction of gravity may be detected (e.g., by a navigational or other sensors of a coupled platform) and converted into a frame of reference of the platform and/or the radial counterbalance mechanism. The counterbalance weight may then be positioned to oppose the deflection of the center of gravity of the payload caused by gravity. More generally, the counterbalance weight may be positioned to oppose the deflection of the center of gravity of the payload caused by any detected acceleration loading, as described herein.

FIG. 1 illustrates a block diagram of articulated sensor/payload system 100 in accordance with an embodiment of the disclosure. In some embodiments, system 100 may be configured to fly over or approach a target and image or sense the target using gimbal system 122 to aim articulated sensor 140 at the target. Resulting imagery and/or other sensor data may be processed (e.g., by articulated sensor 140, platform 110, and/or base station 130) and displayed to a user through use of user interface 132 (e.g., one or more displays such as a multi-function display (MFD), a portable electronic device such as a tablet, laptop, or smart phone, or other appropriate interface) and/or stored in memory for later viewing and/or analysis. In some embodiments, system 100 may be configured to use such imagery and/or sensor data to control operation of platform 110 and/or articulated sensor 140, as described herein, such as controlling gimbal system 122 to aim articulated sensor 140 towards a particular direction, or controlling propulsion system 124 to move platform 110 to a desired position relative to a target (e.g., where platform 110 is mobile).

In the embodiment shown in FIG. 1, articulated sensor system 100 includes platform 110, optional base station 130, and at least one articulated sensor/payload 140. Platform 110 may be a fixed platform, for example, or may be a mobile platform configured to move or fly and position and/or aim articulated sensor 140 (e.g., relative to a designated or detected target). As shown in FIG. 1, platform 110 may include one or more of a controller 112, an orientation sensor 114, a gyroscope/accelerometer 116, a global navigation satellite system (GNSS) 118, a communications module 120, a gimbal system 122, a propulsion system 124, and other modules 126. Operation of platform 110 may be substantially autonomous and/or partially or completely controlled by optional base station 130, which may include one or more of a user interface 132, a communications module 134, and other modules 136. In other embodiments, platform 110 may include one or more of the elements of base station 130, such as with various types of manned aircraft, terrestrial vehicles, and/or watercraft. Articulated sensor 140 may be physically coupled to platform 110 and be configured to capture sensor data (e.g., visible spectrum images, infrared images, narrow aperture radar data, and/or other sensor data) of a target position, area, and/or object(s) as selected and/or framed by operation of platform 110 and/or base station 130. In some embodiments, one or more of the elements of system 100 may be implemented in a combined housing or structure that can be coupled to or within platform 110 and/or held or carried by a user of system 100. In some embodiments, platform 110 may correspond to a handheld device.

Controller 112 may be implemented as any appropriate logic device (e.g., processing device, microcontroller, processor, application specific integrated circuit (ASIC), field programmable gate array (FPGA), memory storage device, memory reader, or other device or combinations of devices) that may be adapted to execute, store, and/or receive appropriate instructions, such as software instructions implementing a control loop for controlling various operations of platform 110 and/or other elements of system 100, for example. Such software instructions may also implement methods for processing infrared images and/or other sensor signals, determining sensor information, providing user feedback (e.g., through user interface 132), querying devices for operational parameters, selecting operational parameters for devices, or performing any of the various operations described herein (e.g., operations performed by logic devices of various devices of system 100).

In addition, a non-transitory medium may be provided for storing machine readable instructions for loading into and execution by controller 112. In these and other embodiments, controller 112 may be implemented with other components where appropriate, such as volatile memory, non-volatile memory, one or more interfaces, and/or various analog and/or digital components for interfacing with devices of system 100. For example, controller 112 may be adapted to store sensor signals, sensor information, parameters for coordinate frame transformations, calibration parameters, sets of calibration points, and/or other operational parameters, over time, for example, and provide such stored data to a user using user interface 132. In some embodiments, controller 112 may be integrated with one or more other elements of platform 110, for example, or distributed as multiple logic devices within platform 110, base station 130, and/or articulated sensor 140.

Orientation sensor 114 may be implemented as one or more of a compass, float, accelerometer, and/or other device capable of measuring an orientation of platform 110 (e.g., magnitude and direction of roll, pitch, and/or yaw, relative to one or more reference orientations such as gravity and/or Magnetic North), gimbal system 122, radial counterbalance mechanism 160, articulated sensor/payload 150, and/or other elements of system 100, and providing such measurements as sensor signals that may be communicated to various devices of system 100. Gyroscope/accelerometer 116 may be implemented as one or more electronic sextants, semiconductor devices, integrated chips, accelerometer sensors, accelerometer sensor systems, or other devices capable of measuring angular velocities/accelerations and/or linear accelerations (e.g., direction and magnitude) of platform 110 and/or other elements of system 100 and providing such measurements as sensor signals that may be communicated to other devices of system 100 (e.g., user interface 132, controller 112).

GNSS 118 may be implemented according to any global navigation satellite system, including a GPS, GLONASS, and/or Galileo based receiver and/or other device capable of determining absolute and/or relative position of platform 110 (e.g., or an element of platform 110) based on wireless signals received from space-born and/or terrestrial sources (e.g., eLoran, and/or other at least partially terrestrial systems), for example, and capable of providing such measurements as sensor signals that may be communicated to various devices of system 100. In some embodiments, GNSS 118 may include an altimeter, for example, or may be used to provide an absolute altitude.

Communications module 120 may be implemented as any wired and/or wireless communications module configured to transmit and receive analog and/or digital signals between elements of system 100. For example, communications module 120 may be configured to receive flight control signals from base station 130 and provide them to controller 112 and/or propulsion system 124. In other embodiments, communications module 120 may be configured to receive images and/or other sensor information (e.g., visible spectrum and/or infrared still images or video images) from articulated sensor 140 and relay the sensor data to controller 112 and/or base station 130. In some embodiments, communications module 120 may be configured to support spread spectrum transmissions, for example, and/or multiple simultaneous communications channels between elements of system 100.

In some embodiments, gimbal system 122 may be implemented as an actuated gimbal mount, for example, that may be controlled by controller 112 to stabilize articulated sensor 140 relative to a target or to aim articulated sensor 140 according to a desired direction and/or relative position. As such, gimbal system 122 may be configured to provide a relative orientation of articulated sensor 140 (e.g., relative to an orientation of platform 110) to controller 112 and/or communications module 120 (e.g., gimbal system 122 may include its own orientation sensor 114). In other embodiments, gimbal system 122 may be implemented as a gravity driven mount (e.g., non-actuated). In various embodiments, gimbal system 122 may be configured to provide power, support wired communications, and/or otherwise facilitate operation of articulated sensor/payload 140. In further embodiments, gimbal system 122 may be configured to couple to a laser pointer, range finder, and/or other device, for example, to support, stabilize, power, and/or aim multiple devices (e.g., articulated sensor 140 and one or more other devices) substantially simultaneously.

In various embodiments, gimbal system 122 may include radial counterbalance mechanism (RCM) 160, which may be configured to reduce orientation errors in the operation of gimbal system 122 caused by elements of articulated sensor/payload 140 sagging or otherwise causing the center of gravity of articulated sensor/payload 140 to move away from one or more rotational axes of gimbal system 122, as described herein. RCM 160 may include a counterbalance weight and a motor coupled to the counterbalance weight, for example, and a controller (e.g., controller 112) may be configured to control the position of the counterbalance weight to reduce a radial displacement of the center of gravity of articulated sensor/payload 140 from a particular rotational axis of gimbal system 122. Maintaining the alignment of the center of gravity of articulated sensor/payload 140 to an appropriate rotational axis of gimbal system 122 substantially eliminates orientation errors otherwise caused by misalignment (e.g., due to unexpected orientation-dependent varying loads on the actuators or other forces acting on gimbal system 122 and/or articulated sensor/payload 140). In alternative embodiments, RCM 160 may be integrated with articulated sensor/payload 140, as shown.

Propulsion system 124 may be implemented as one or more propellers, turbines, or other thrust-based propulsion systems, and/or other types of propulsion systems that can be used to provide motive force and/or lift to platform 110 and/or to steer platform 110. In some embodiments, propulsion system 124 may include multiple propellers (e.g., a tri, quad, hex, oct, or other type "copter") that can be controlled (e.g., by controller 112) to provide lift and motion for platform 110 and to provide an orientation for platform 110. In other embodiments, propulsion system 110 may be configured primarily to provide thrust while other structures of platform 110 provide lift, such as in a fixed wing embodiment (e.g., where wings provide the lift) and/or an aerostat embodiment (e.g., balloons, airships, hybrid aerostats). In various embodiments, propulsion system 124 may be implemented with a portable power supply, such as a battery and/or a combustion engine/generator and fuel supply.

Other modules 126 may include other and/or additional sensors, actuators, communications modules/nodes, and/or user interface devices, for example, and may be used to provide additional environmental information related to operation of platform 110, for example. In some embodiments, other modules 126 may include a humidity sensor, a wind and/or water temperature sensor, a barometer, an altimeter, a radar system, a visible spectrum camera or infrared camera (with an additional mount), an irradiance detector, and/or other environmental sensors providing measurements and/or other sensor signals that can be displayed to a user and/or used by other devices of system 100 (e.g., controller 112) to provide operational control of platform 110 and/or system 100. In some embodiments, other modules 126 may include one or more actuated and/or articulated devices (e.g., multi-spectrum active illuminators, visible and/or IR cameras, radars, sonars, and/or other actuated devices) coupled to platform 110, where each actuated device includes one or more actuators adapted to adjust an orientation of the device, relative to platform 110, in response to one or more control signals (e.g., provided by controller 112).

User interface 132 of base station 130 may be implemented as one or more of a display, a touch screen, a keyboard, a mouse, a joystick, a knob, a steering wheel, a yoke, and/or any other device capable of accepting user input and/or providing feedback to a user. In various embodiments, user interface 132 may be adapted to provide user input (e.g., as a type of signal and/or sensor information transmitted by communications module 134 of base station 130) to other devices of system 100, such as controller 112. User interface 132 may also be implemented with one or more logic devices (e.g., similar to controller 112) that may be adapted to store and/or execute instructions, such as software instructions, implementing any of the various processes and/or methods described herein. For example, user interface 132 may be adapted to form communication links, transmit and/or receive communications (e.g., infrared images and/or other sensor signals, control signals, sensor information, user input, and/or other information), for example, or to perform various other processes and/or methods described herein.

In one embodiment, user interface 132 may be adapted to display a time series of various sensor information and/or other parameters as part of or overlaid on a graph or map, which may be referenced to a position and/or orientation of platform 110 and/or other elements of system 100. For example, user interface 132 may be adapted to display a time series of positions, headings, and/or orientations of platform 110 and/or other elements of system 100 overlaid on a geographical map, which may include one or more graphs indicating a corresponding time series of actuator control signals, sensor information, and/or other sensor and/or control signals.

In some embodiments, user interface 132 may be adapted to accept user input including a user-defined target heading, waypoint, route, and/or orientation for an element of system 100, for example, and to generate control signals to cause platform 110 to move according to the target heading, route, and/or orientation, or to aim articulated sensor 140 accordingly. In other embodiments, user interface 132 may be adapted to accept user input modifying a control loop parameter of controller 112, for example.

In further embodiments, user interface 132 may be adapted to accept user input including a user-defined target attitude, orientation, and/or position for an actuated device (e.g., articulated sensor 140) associated with platform 110, for example, and to generate control signals for adjusting an orientation and/or position of the actuated device according to the target attitude, orientation, and/or position. Such control signals may be transmitted to controller 112 (e.g., using communications modules 134 and 120), which may then control platform 110 accordingly.

Communications module 134 may be implemented as any wired and/or wireless communications module configured to transmit and receive analog and/or digital signals between elements of system 100. For example, communications module 134 may be configured to transmit flight control signals from user interface 132 to communications module 120 or 144. In other embodiments, communications module 134 may be configured to receive sensor data (e.g., visible spectrum and/or infrared still images or video images, or other sensor data) from articulated sensor 140. In some embodiments, communications module 134 may be configured to support spread spectrum transmissions, for example, and/or multiple simultaneous communications channels between elements of system 100.

Other modules 136 of base station 130 may include other and/or additional sensors, actuators, communications modules/nodes, and/or user interface devices used to provide additional environmental information associated with base station 130, for example. In some embodiments, other modules 136 may include a humidity sensor, a wind and/or water temperature sensor, a barometer, a radar system, a visible spectrum camera, an infrared camera, a GNSS, and/or other environmental sensors providing measurements and/or other sensor signals that can be displayed to a user and/or used by other devices of system 100 (e.g., controller 112) to provide operational control of platform 110 and/or system 100 or to process sensor data to compensate for environmental conditions, such as an water content in the atmosphere approximately at the same altitude and/or within the same area as platform 110 and/or base station 130, for example. In some embodiments, other modules 136 may include one or more actuated and/or articulated devices (e.g., multi-spectrum active illuminators, visible and/or IR cameras, radars, sonars, and/or other actuated devices), where each actuated device includes one or more actuators adapted to adjust an orientation of the device in response to one or more control signals (e.g., provided by user interface 132).

In embodiments where articulated sensor/payload 140 is implemented as an imaging device, articulated sensor 140 may include imaging module 142, which may be implemented as a cooled and/or uncooled array of detector elements, such as visible spectrum and/or infrared sensitive detector elements, such as quantum well infrared photodetector elements, bolometer or microbolometer based detector elements, type II superlattice based detector elements, and/or other infrared spectrum detector elements that can be arranged in a focal plane array. In various embodiments, imaging module 142 may include one or more logic devices (e.g., similar to controller 112) that can be configured to process imagery captured by detector elements of imaging module 142 before providing the imagery to memory 146 or communications module 144. More generally, imaging module 142 may be configured to perform any of the operations or methods described herein, at least in part, or in combination with controller 112 and/or user interface 132.

In some embodiments, articulated sensor 140 may be implemented with a second or additional imaging modules similar to imaging module 142, for example, that may be include detector elements configured to detect other spectrums, such as visible light, ultraviolet, and/or other spectrums or subsets of spectrums. In various embodiments, such additional imaging modules may be calibrated or registered to imaging module 142 such that images captured by each imaging module occupy a known and at least partially overlapping field of view of the other imaging modules, thereby allowing different spectrum images to be geometrically registered to each other (e.g., by scaling and/or positioning). In some embodiments, different spectrum images may be registered to each other using pattern recognition processing in addition or as an alternative to reliance on a known overlapping field of view.

Communications module 144 of articulated sensor 140 may be implemented as any wired and/or wireless communications module configured to transmit and receive analog and/or digital signals between elements of system 100. For example, communications module 144 may be configured to transmit infrared images from imaging module 142 to communications module 120 or 134. In other embodiments, communications module 144 may be configured to receive control signals (e.g., control signals directing capture, focus, selective filtering, and/or other operation of articulated sensor 140) from controller 112 and/or user interface 132. In some ebodiments, communications module 144 may be configured to support spread spectrum transmissions, for example, and/or multiple simultaneous communications channels between elements of system 100.

Memory 146 may be implemented as one or more machine readable mediums and/or logic devices configured to store software instructions, sensor signals, control signals, operational parameters, calibration parameters, infrared images, and/or other data facilitating operation of system 100, for example, and provide it to various elements of system 100. Memory 146 may also be implemented, at least in part, as removable memory, such as a secure digital memory card for example including an interface for such memory.

Orientation sensor 148 of articulated sensor 140 may be implemented similar to orientation sensor 114 or gyroscope/accelerometer 116, and/or any other device capable of measuring an orientation of articulated sensor 140, imaging module 142, and/or other elements of articulated sensor 140 (e.g., magnitude and direction of roll, pitch, and/or yaw, relative to one or more reference orientations such as gravity and/or Magnetic North) and providing such measurements as sensor signals that may be communicated to various devices of system 100. GNSS 150 of articulated sensor 140 may be implemented according to any global navigation satellite system, including a GPS, GLONASS, and/or Galileo based receiver and/or other device capable of determining absolute and/or relative position of articulated sensor 140 (e.g., or an element of articulated sensor 140) based on wireless signals received from space-born and/or terrestrial sources, for example, and capable of providing such measurements as sensor signals that may be communicated to various devices of system 100.

Other modules 152 of articulated sensor 140 may include other and/or additional sensors, actuators, communications modules/nodes, cooled or uncooled optical filters, and/or user interface devices used to provide additional environmental information associated with articulated sensor 140, for example. In some embodiments, other modules 152 may include a humidity sensor, a wind and/or water temperature sensor, a barometer, a radar system, a visible spectrum camera, an infrared camera, a GNSS, and/or other environmental sensors providing measurements and/or other sensor signals that can be displayed to a user and/or used by imaging module 142 or other devices of system 100 (e.g., controller 112) to provide operational control of platform 110 and/or system 100 or to process imagery to compensate for environmental conditions.

As noted herein, in various embodiments, articulated sensor/payload 140 may include radial counterbalance mechanism (RCM) 160, which may be configured to reduce orientation errors in the operation of gimbal system 122 to orient articulated sensor/payload 140 caused by elements of articulated sensor/payload 140 sagging or otherwise causing the center of gravity of articulated sensor/payload 140 to move away from one or more rotational axes of gimbal system 122, as described herein.

In general, each of the elements of system 100 may be implemented with any appropriate logic device (e.g., processing device, microcontroller, processor, application specific integrated circuit (ASIC), field programmable gate array (FPGA), memory storage device, memory reader, or other device or combinations of devices) that may be adapted to execute, store, and/or receive appropriate instructions, such as software instructions implementing a method for providing sensor data and/or imagery, for example, or for transmitting and/or receiving communications, such as sensor signals, sensor information, and/or control signals, between one or more devices of system 100.

In addition, one or more non-transitory mediums may be provided for storing machine readable instructions for loading into and execution by any logic device implemented with one or more of the devices of system 100. In these and other embodiments, the logic devices may be implemented with other components where appropriate, such as volatile memory, non-volatile memory, and/or one or more interfaces (e.g., inter-integrated circuit (I2C) interfaces, mobile industry processor interfaces (MIPI), joint test action group (JTAG) interfaces (e.g., IEEE 1149.1 standard test access port and boundary-scan architecture), and/or other interfaces, such as an interface for one or more antennas, or an interface for a particular type of sensor).

Sensor signals, control signals, and other signals may be communicated among elements of system 100 using a variety of wired and/or wireless communication techniques, including voltage signaling, Ethernet, WiFi, Bluetooth, Zigbee, Xbee, Micronet, or other medium and/or short range wired and/or wireless networking protocols and/or implementations, for example. In such embodiments, each element of system 100 may include one or more modules supporting wired, wireless, and/or a combination of wired and wireless communication techniques. In some embodiments, various elements or portions of elements of system 100 may be integrated with each other, for example, or may be integrated onto a single printed circuit board (PCB) to reduce system complexity, manufacturing costs, power requirements, coordinate frame errors, and/or timing errors between the various sensor measurements.

Each element of system 100 may include one or more batteries, capacitors, or other electrical power storage devices, for example, and may include one or more solar cell modules or other electrical power generating devices. In some embodiments, one or more of the devices may be powered by a power source for platform 110, using one or more power leads. Such power leads may also be used to support one or more communication techniques between elements of system 100.

Figure 2:
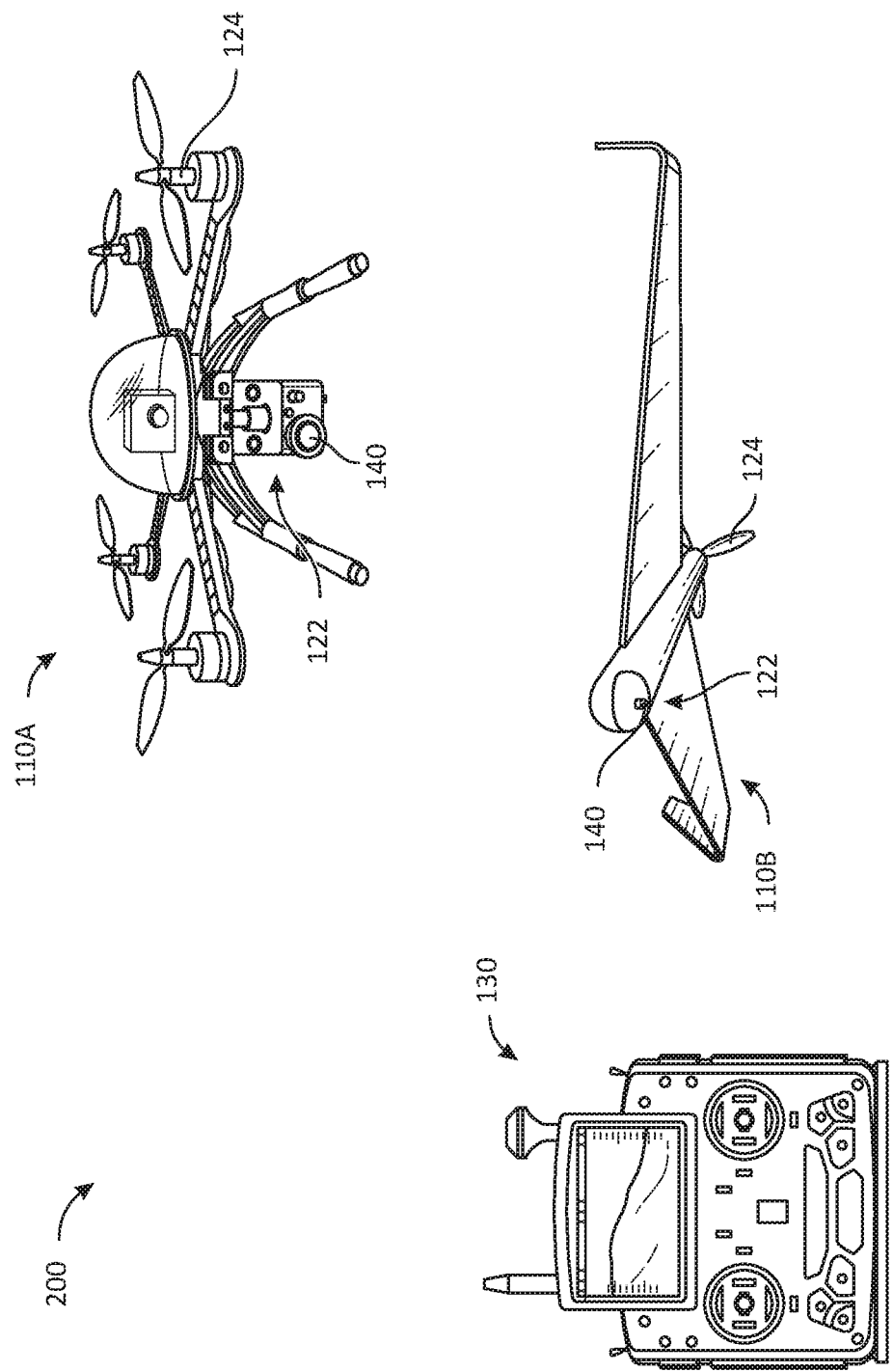
FIG. 2 illustrates a diagram of mobile platforms of an articulated sensor/payload system including articulated sensors and associated gimbal systems and radial counterbalance mechanisms in accordance with an embodiment of the disclosure.

FIG. 2 illustrates a diagram of mobile platforms 110A and 110B of articulated sensor/payload system 200 including articulated sensors/payloads 140 and associated gimbal systems 122 and radial counterbalance mechanisms (e.g., integrated with gimbal systems 122 and/or payloads 140) in accordance with an embodiment of the disclosure. In the embodiment shown in FIG. 2, articulated sensor/payload system 200 includes base station 130, platform 110A with articulated sensor/payload 140 and gimbal system 122, and platform 110B with articulated sensor/payload 140 and gimbal system 122, where base station 130 may be configured to control motion, position, and/or orientation of platform 110A, platform 110B, and/or payloads 140.

Figure 3:
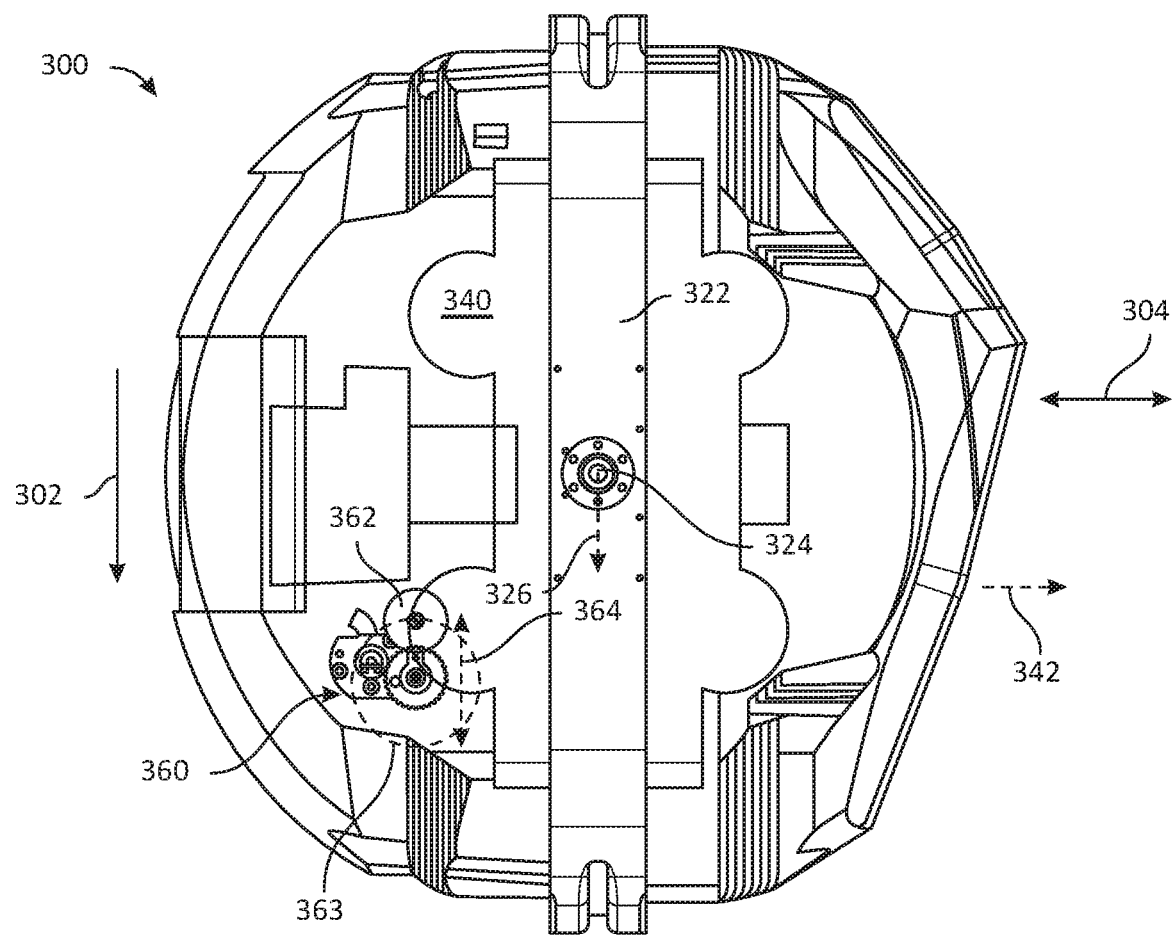
FIG. 3 illustrates a diagram of an articulated payload system including a radial counterbalance mechanism in accordance with an embodiment of the disclosure.

FIG. 3 illustrates a diagram of an articulated payload system 300 including a radial counterbalance mechanism 360 in accordance with an embodiment of the disclosure. As shown in FIG. 3, articulated payload system 300 includes payload/payload housing 340, gimbal/gimbal ring 322 coupled to payload 340, and radial counterbalance mechanism 360 coupled to or within payload 340. In various embodiments, articulated payload system 300 may include various additional elements, such as any of the elements of articulated payload system 100 shown in and/or described with respect to FIG. 1, including additional gimbals/gimbal rings, actuators to rotate gimbal ring 322 and payload 340 about rotational axis/bearing axis 324, and various wired power and/or communication links to facilitate operation of articulated payload system 300. In embodiments where payload 340 corresponds to a directional sensor, such as an imager, payload 340 may be orientated to view a particular direction along line of sight 342.

In typical operations, elements of articulated payload system 300 may experience acceleration loading due to, for example, gravity 302 and/or platform accelerations 304. In situations where platform accelerations 304 are perpendicular to gravity 302, as shown in FIG. 3, the center of gravity (CoG) of payload 340 may displace from rotational axis 324 roughly in a direction along gravity 302, as shown by displacement vector 326. Radial counterbalance mechanism 360 may be configured to position a counterbalance weight 362 at a compensating radial weight position to reduce such displacement (e.g., displacement vector 326), such as by positioning counterbalance weight 362 along counterbalance path 363 to counteract gravity 302 and/or other acceleration loadings causing displacement 326 of the CoG of payload 340. At the orientation shown in FIG. 3, and with displacement 326 being primarily due to gravity 302, counterbalance weight 362 may be positioned along counterbalance path 363 such that the component of its position along gravity 302 (e.g., shown as counterbalance loading vector 364) is roughly aligned with displacement vector 326.

More generally, counterbalance weight 362 may be positioned along counterbalance path 363 such that its mass multiplied by its deviation vector (e.g., counterbalance loading vector 364) substantially equals the mass of payload 340, multiplied by displacement vector 326, as gimbal ring 322 and payload 340 rotate about rotational axis 324, such that the resulting effective CoG of articulated payload system 300/payload 340 realigns with rotational axis 324. In various embodiments, counterbalance path 363 may be a planar path in a plane that is substantially perpendicular to rotational axis 324, and each of displacement vector 326 and deviation/counterbalance loading vector 364 may be two dimensional vectors corresponding to radial displacements/deviations relative to rotational axis 324. Counterbalance path 363 may be a circular path, for example, or may be patterned or have a different shape, such as in cases where the magnitude of displacement vector 326 is asymmetric with respect to an orientation of payload 340 relative to loading (e.g., due to gravity 302 and/or platform accelerations 304). As noted herein, the displacement 326 of the CoG of payload 340 may be associated with deflections in gimbal ring 322, in payload housing 340, and/or of other elements within payload housing 340, for example, caused by such loading.

Radial counterbalance mechanism 360 may be implemented as a mechanical arrangement including a single motor or actuator and a motor coupling configured to control and adjust a radial position of counterbalance weight 362 relative to rotational axis 324 of gimbal/gimbal ring 322. In various embodiments, radial counterbalance mechanism 360 may include a position or orientation sensor configured to provide an orientation of counterbalance weight 362 (e.g., as a function of a position or rotational state of a motor or motor coupling for radial counterbalance mechanism 360), so that radial counterbalance mechanism 360 may be implemented generally as a servomechanism using feedback of the radial position of counterbalance 362, along with orientations of payload 340 and/or gimbal ring 322, relative to each other and/or to gravity 302 and/or other loading (e.g., platform accelerations 304) to position counterbalance weight 362.

Counterbalance weight 362 may be any bulk material or combination of materials that may securely couple to other elements of radial counterbalance mechanism 360 and be positioned along counterbalance path 363 to compensate for displacement 324 of a CoG of payload 340 caused by variable loading. In various embodiments, counterbalance weight 362 may be a circular disk or sphere made of a relatively dense and strong material (e.g., steel) so as to present a relatively small volume to be positioned within payload housing 340 and to be relatively resistant to deflection caused by loading.

Payload 340 may be implemented as any articulated payload, such as an articulated directional sensor, as described herein. In various embodiments, payload 340 may be implemented as a visible spectrum and/or infrared imaging system, for example, configured to image objects along line of sight 342. More generally, line of sight 342 may correspond to a direction indicating an orientation of payload 340, regardless of the type of articulated payload it is. In some embodiments, payload 340 may be a laser targeting system configured to aim a laser beam emitted along line of sight 342 towards a desired target and/or along a desired direction.

Gimbal/gimbal ring 322 may form part of gimbal system 122 and be implemented as a ring, support, or strap configured to couple to payload/payload housing 340 and allow adjustable orientation of payload 340 about rotational axis 324 (e.g., which may correspond to a bearing axis for gimbal ring 322). Typically, gimbal ring 322 is coupled to other elements of gimbal system 122, such as actuators to rotate gimbal ring 322 and platform 340 about rotational axis 324, additional gimbal rings to provide other adjustable orientation degrees of freedom for payload 340, a mount to couple gimbal system 122 to platform 110, and/or various wired power or communication links to gimbal system 122 and/or other elements of platform 110 and/or payload 140/340.

In general, gimbal ring 322 is designed to be coupled to payload 340 such that rotational axis 324 is substantially aligned with the designed CoG of payload 340. However, acceleration loading may cause gimbal ring 322 and/or payload housing 340 to deflect, which in turn may cause a misalignment of rotational axis 324 with the CoG of payload 340. The misalignment may result in an imbalance under acceleration loads that are perpendicular to gravity 302, which can cause undesirable torques on payload 340 and corresponding orientation errors and/or jitter in the controlled orientation of payload 340. Thus, it is beneficial to include a mechanism to compensate for such changes, and further to compensate for other mass distribution changes within payload 340 (e.g., caused by component wear or use) without necessitating a redesign of payload 340 or removal and refitting of payload 340 to gimbal ring 322. Notably, only radial displacements of the CoG of payload 340, relative to rotational axis 324, cause orientation errors under loading with respect to rotations about rotational axis 324, and so radial counterbalance mechanism 360 may be simplified to only compensate for such radial displacements of the CoG of payload 340.

In particular, counterbalance weight 362 may only need to be adjustably positionable within a plane that is perpendicular to rotational axis 324 in order to provide appropriate compensation for radial displacement 326, as described herein, and so radial counterbalance mechanism 360 may be placed anywhere within payload housing 340, as long as counterbalance weight 362 can be repositioned radially relative to rotational axis 324. In the embodiment shown in FIG. 3, rotational axis 324 may correspond to an elevation angle of line of sight 342 (e.g., relative to a horizon or gravity), for example, and counterbalance path 363 may lie within a plane defined by the range of elevation angles achievable by articulated payload system 300. In embodiments where platform 110 is a flight platform, the range of elevation angles achievable by articulated payload system 300 may be a full 360 degrees, and so counterbalance path 363 may be a closed counterbalance path (e.g., a counterbalance path encompassing 360 degrees of orientations for counterbalance weight 362).

In various embodiments, the mass of counterbalance weight 362 and the pattern of counterbalance path 363 may be selected to be able to compensate for the expected loading of payload 340 and the corresponding displacement 326 of the CoG of payload 340. In some embodiments, the expected loading may include gravity 302 (e.g., as experienced along any range of relative orientations of payload 340), for example, and may include a range of platform accelerations 304 expected during operation of articulated payload system 300. As such, counterbalance weight 362 may be positioned to compensate for loading due to gravity 302 only or due to both gravity and additional loading associated with platform accelerations 304. The range of deflections 326 corresponding to the expected loading may be determined through design, through direct measurement at time of manufacture (e.g., by strain gauges arranged on or within payload 140 and/or gimbal ring 122), or through direct measurement after deployment (e.g., using feedback from operation of payload 340 and/or gimbal system 122 and correlated measurements by associated accelerometers/gyroscopes, as described herein).

Figure 4:
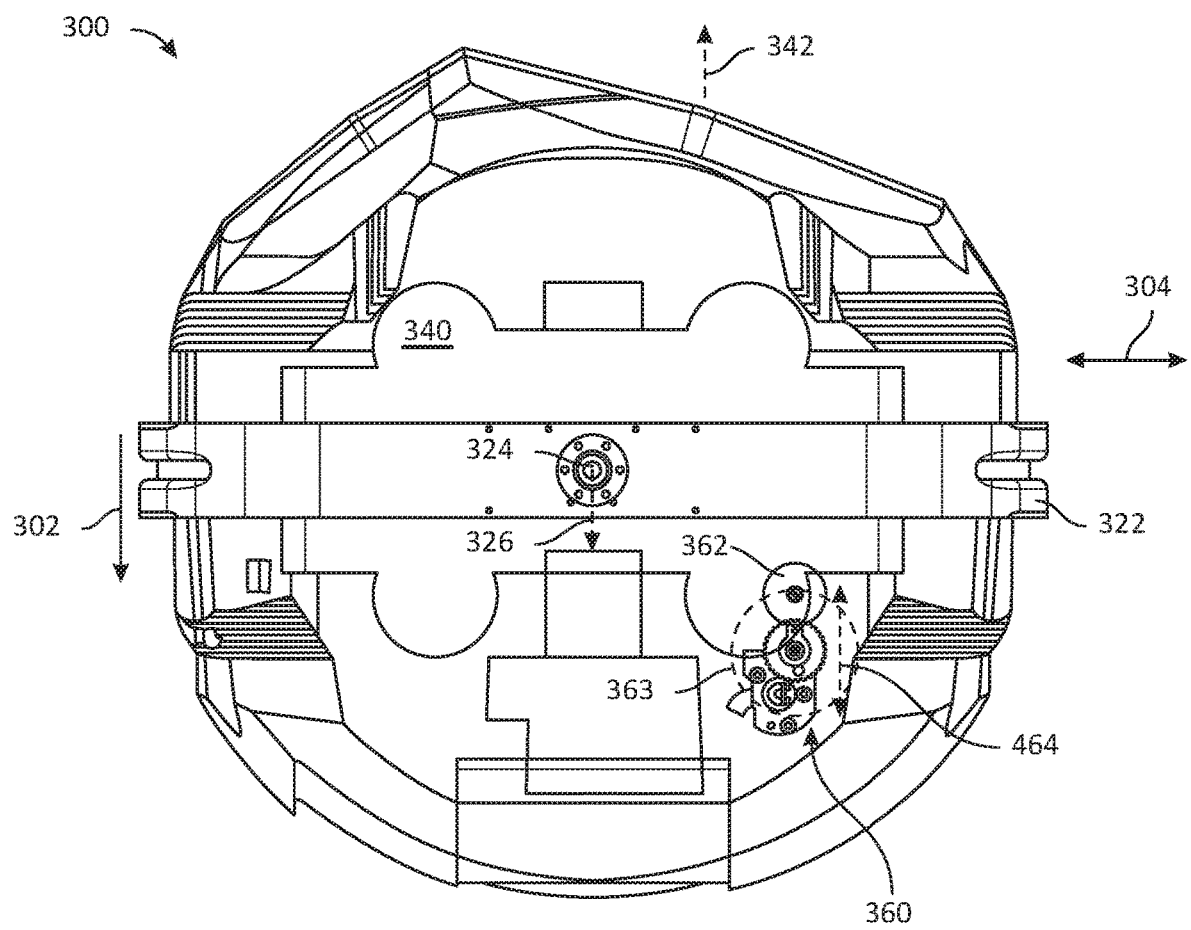
FIG. 4 illustrates a diagram of an articulated payload system including a radial counterbalance mechanism in accordance with an embodiment of the disclosure.

FIG. 4 illustrates a diagram of articulated payload system 300 including radial counterbalance mechanism 360 in accordance with an embodiment of the disclosure. In particular, FIG. 4 shows articulated payload system 300 of FIG. 3 at a different orientation and with different directional loading. For example, line of sight 342 is aligned with but pointing away from gravity 302, such that displacement vector 326 is pointing away from line of sight 342 and is not perpendicular to line of sign 342, as in FIG. 3. Additionally, counterbalance deviation vector 464 is also aligned with line of sight 342. However, in the embodiment shown in FIG. 4, displacement vector 326 and counterbalance deviation vector 464 are still substantially aligned with gravity 302. In embodiments where platform accelerations 304 cause further displacements of the CoG of platform 340, displacement vector 326 and counterbalance deviation vector 464 may be aligned with the vector sum of gravity and platform accelerations 304.

Figure 5:
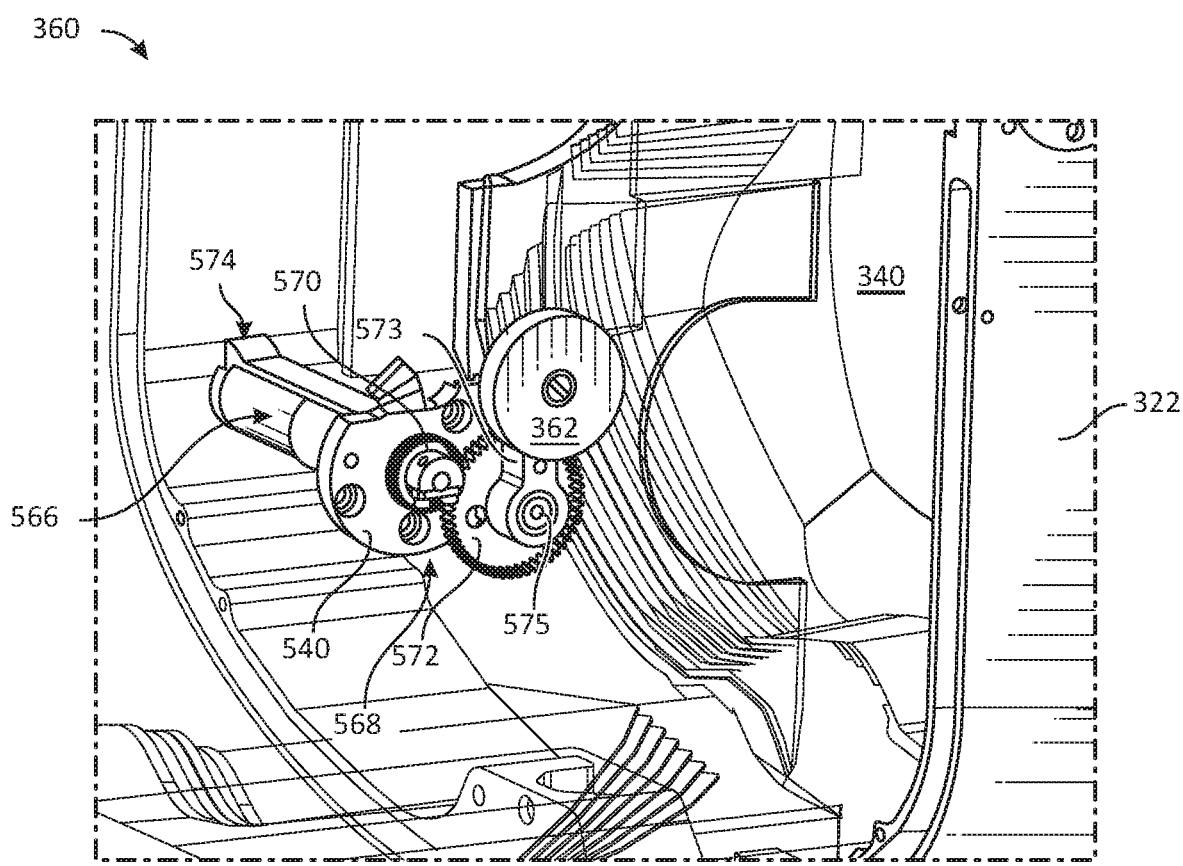
FIG. 5 illustrates a diagram of a radial counterbalance mechanism for an articulated payload system in accordance with an embodiment of the disclosure.

FIG. 5 illustrates a diagram of radial counterbalance mechanism 360 for articulated payload system 300 in accordance with an embodiment of the disclosure. As shown in FIG. 5, radial counterbalance mechanism 360 includes motor 566 configured to adjust a radial position of counterbalance weight 362 (e.g., relative to rotational axis 324 of gimbal ring 322, for example, or other element of gimbal system 122). In various embodiments, radial counterbalance mechanism 360 may include a weight position or orientation sensor 574 configured to provide a position of counterbalance weight 362, such as along counterbalance path 363, and motor 566 may be coupled to counterbalance weight 362 through motor coupling 568. In general, motor 566 may be controlled by any logic device (e.g., controller 112) configured to communicate with motor 566 and position/orientation sensor 574, so as to provide roughly servomechanism control of a position of counterbalance weight 362. Generally, position/orientation sensor 574 may be implemented as an optical encoder, a counter, and/or other sensor configured to measure an orientation or position of motor 566, counterbalance weight 362, and/or elements of motor coupling 568 and provide such orientation for use in determining a radial position of counterbalance weight 362 (e.g., along counterbalance path 363, relative to counterbalance axis 575).

In the embodiment shown in FIG. 5, motor coupling 568 is implemented as a planetary gear set including central gear 573 coupled directly to a rotating shaft of motor 566, outer gear 572, and a lever arm 573 configured to translate rotational motion of outer gear 572 about counterbalance axis 575 (e.g., actuated by motor 566) into a variable radial deviation of counterbalance weight 362, such as positions along counterbalance path 363 of FIGS. 3-4. In some embodiments, lever arm 573 may include a slot to allow counterbalance weight 362 to be positioned at a variable distance along a length of lever arm 573, so as to fine tune the compensating effect of the positioning of counterbalance weight 362. In general, the orientation of counterbalance weight 362 may correspond to the direction from counterbalance axis 575 to the current position of counterbalance weight 362 (e.g., along counterbalance path 363), and such orientation may be referenced to an orientation of payload 340 (e.g., line of sight 342), to an orientation of gimbal ring 322, to gravity 302, and/or to another absolute or relative orientation, as described herein.

In other embodiments, motor coupling 568 may be implemented as a worm drive, spring preload gear set, or other motor coupling arrangement configured to reduce a risk of back driving, backlash, or sloppy positioning of counterbalance weight 362 under loading. In various embodiments, motor coupling 568 may include a cam or other mechanical device configured to provide a patterned counterbalance path for counterbalance weight 362 about counterbalance axis 575 (e.g., a substantially planar counterbalance path dependent upon a rotation angle or orientation of counterbalance weight 362 provided by motor 566, such as a counterbalance path different from a circular counterbalance path). Motor 566 and/or motor coupling 568 may be secured to payload 340 and/or gimbal ring 322 through a mounting plate 540. In some embodiments, mounting plate 540 may be integrated with payload housing 340.

Figure 6:
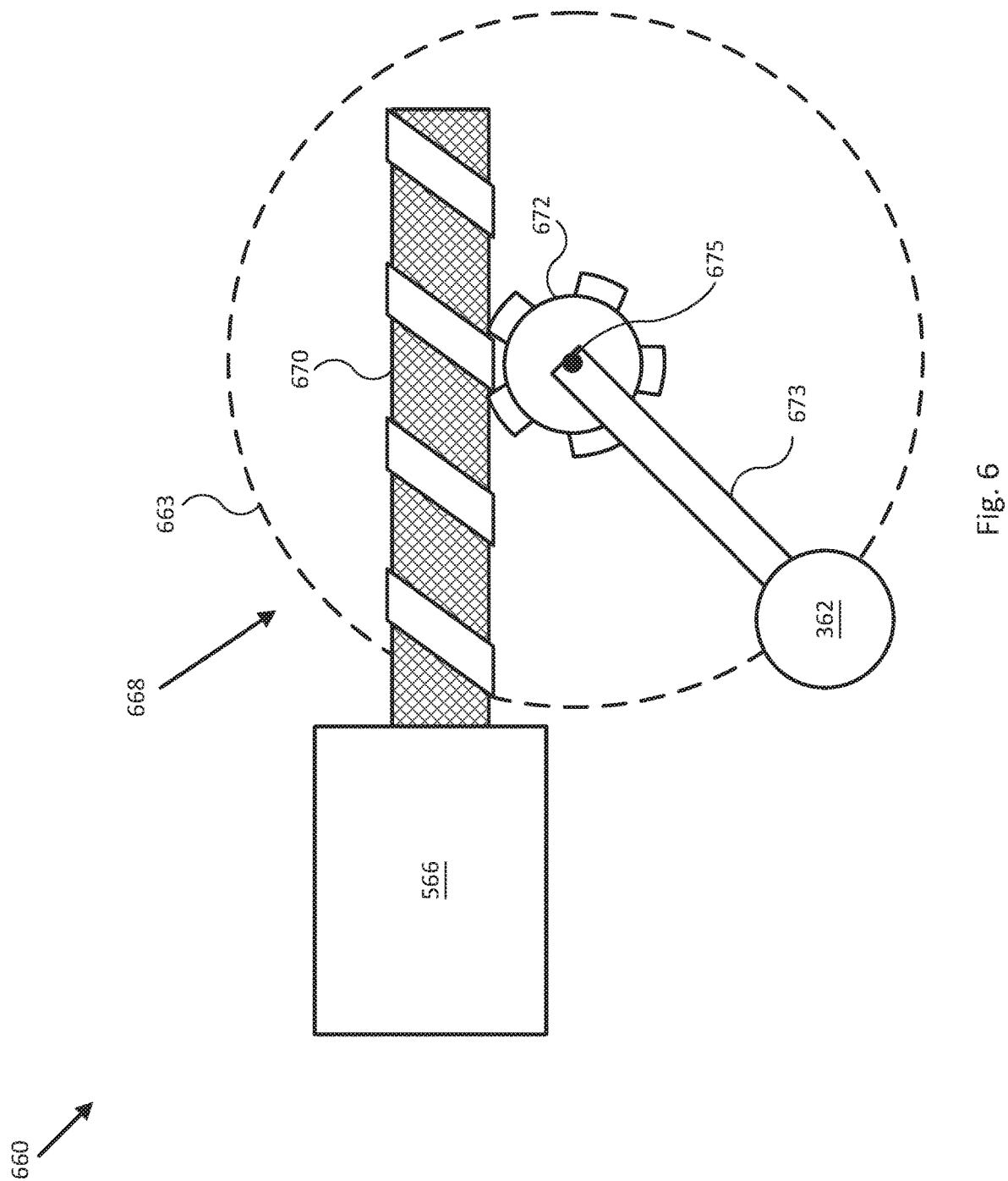
FIG. 6 illustrates a diagram of a radial counterbalance mechanism for an articulated payload system in accordance with an embodiment of the disclosure.

FIG. 6 illustrates a diagram of a radial counterbalance mechanism 660 for articulated payload system 300 in accordance with an embodiment of the disclosure. As shown in FIG. 6, radial counterbalance mechanism 660 includes motor 566 coupled to counterbalance weight 362 through motor coupling 668 and configured to adjust a radial position of counterbalance weight 362 (e.g., relative to rotational axis 324 of gimbal ring 322, for example, or other element of gimbal system 122) along counterbalance path 668, relative to counterbalance axis 675. In the embodiment shown in FIG. 6, motor coupling 668 is implemented as a worm drive gear set including worm gear 670 coupled directly to a rotating shaft of motor 566, central gear 672 rotatably engaged with worm gear 670 to as to rotate in a plane perpendicular to the rotational axis of worm gear 670, and a lever arm 673 configured to translate rotational motion of central gear 672 about counterbalance axis 675 into a variable radial displacement of counterbalance weight 362, such as along counterbalance path 663.

In some embodiments, lever arm 673 may include a slot to allow counterbalance weight 362 to be positioned at a variable distance along a length of lever arm 673, so as to fine tune the compensating effect of the radial positioning of counterbalance weight 362. In various embodiments, motor coupling 668 may include a cam or other mechanical device configured to provide a patterned counterbalance path 663 about counterbalance axis 675 for counterbalance weight 362 (e.g., a counterbalance path different from a circular counterbalance path). Motor 566 and/or motor coupling 668 may be secured to payload 340 and/or gimbal ring 322 through a mounting plate or other mounting coupled to motor 566, for example, which may be integrated with payload housing 340.

Figure 7:
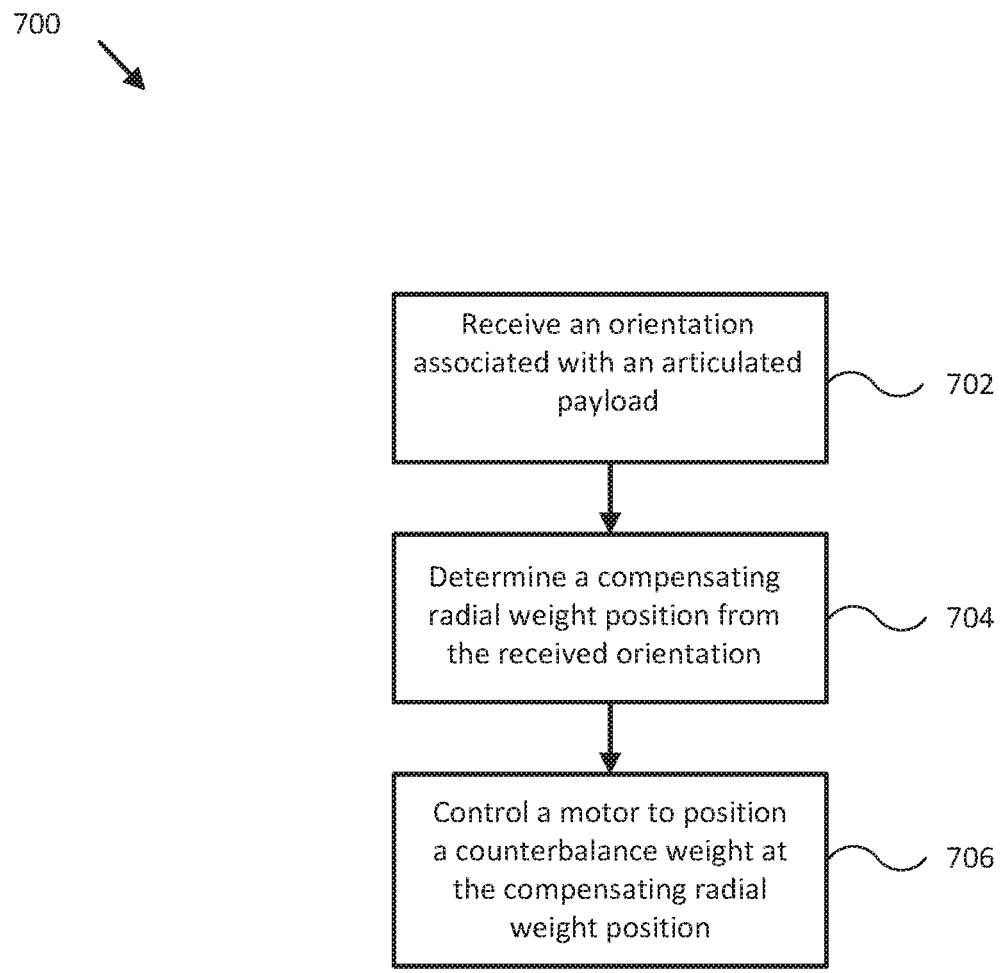
FIG. 7 illustrates a flow diagram of various operations to counterbalance an articulated sensor or payload relative to a gimbal system using a radial counterbalance mechanism in accordance with an embodiment of the disclosure.

FIG. 7 illustrates a flow diagram 700 of various operations to counterbalance payload 140 relative to gimbal system 122 using radial counterbalance mechanism 160 in accordance with an embodiment of the disclosure. In some embodiments, the operations of FIG. 7 may be implemented as software instructions executed by one or more logic devices associated with corresponding electronic devices, sensors, and/or structures depicted in FIGS. 1-6. More generally, the operations of FIG. 7 may be implemented with any combination of software instructions, mechanical elements, and/or electronic hardware (e.g., inductors, capacitors, amplifiers, actuators, or other analog and/or digital components).

It should also be appreciated that any step, sub-step, sub-process, or block of process 700 may be performed in an order or arrangement different from the embodiments illustrated by FIG. 7. For example, in other embodiments, one or more blocks may be omitted from or added to the process. Furthermore, block inputs, block outputs, various sensor signals, sensor information, calibration parameters, and/or other operational parameters may be stored to one or more memories prior to moving to a following portion of a corresponding process. Although process 700 is described with reference to systems described in FIGS. 1-6, process 700 may be performed by other systems different from those systems and including a different selection of electronic devices, sensors, assemblies, mechanisms, platforms, and/or platform attributes.

At block 702, an orientation associated with an articulated payload is received. For example, controller 112 may be configured to receive an orientation of platform 110, gimbal system 122, payload 140, counterbalance weight 362 of radial counterbalance mechanism 160, and/or other elements of systems 100-500, for example, from orientation sensor 114 and/or 118. In one embodiment, controller 112 may be configured to receive an absolute orientation of payload 140 (e.g., relative to gravity), for example. In another embodiment, controller 112 may be configured to receive an absolute orientation of platform 110 and a relative orientation of gimbal system 122, for example, such that an absolute orientation of payload 140 (e.g., relative to gravity) may be derived from the absolute orientation of platform 110 and the relative orientation of gimbal system 122. In other embodiments, controller 112 may be configured to receive an absolute orientation of gimbal system 122 such that an absolute orientation of payload 140 may be derived from the absolute orientation of gimbal system 122. In various embodiments, controller 112 may be configured to receive an orientation of counterbalance weight 362 of radial counterbalance mechanism 160, for example, from orientation sensor/encoder 574.

In some embodiments, controller 112 may also be configured to receive an acceleration of platform 110, gimbal system 122, payload 140, and/or other elements of systems 100-500, from gyroscope/accelerometer 116 for example, such that an absolute orientation of any of platform 110, gimbal system 122, and/or payload 140 (e.g., relative to gravity) may be determined. In related embodiments, a time series of such accelerations may be used to differentiate accelerations due to gravity 302 from other platform accelerations 304, for example, and to determine an absolute acceleration of platform (e.g., referenced to gravity 302).

At block 704, a compensating radial weight position is determined. For example, controller 112 may be configured to determine a compensating radial weight position for counterbalance weight 362 based, at least in part, on the orientation(s) received in block 702. In various embodiments, the determined compensating radial weight position is configured to reduce radial displacement 326 of a center of gravity of payload 340 from rotational axis 324 of gimbal ring 322.

Radial displacement 326 may be caused by loading due to gravity 302, for example, or due to the combination of gravity 302 and various platform accelerations 304. In embodiments where only displacements due to gravitational loading are counterbalanced, the compensating radial weight position may be or correspond to an orientation of counterbalance weight 362 relative to payload 340 that opposes gravity 302. For example, orientations that oppose gravity 302 may include orientations corresponding to positions of counterbalance weight 362 along an upper half of counterbalance path 363 (e.g., relative to gravity 302). In one embodiment, a mass of counterbalance weight 362 and a pattern of counterbalance path 363 (e.g., corresponding to a length of lever arm 573 or 673 and/or implemented by a cam mechanism, for example) may be selected to fully compensate for gravitational loading when the orientation of compensating weight 362 relative to counterbalance axis 575 or 675 is opposite to the direction of gravity 302. In embodiments where displacements due to all acceleration loadings are counterbalanced, the compensating radial weight position may be or correspond to an orientation of counterbalance weight 362 relative to payload 340 that opposes the sum of gravity 302 and platform accelerations 304 (e.g., corresponding to positions of counterbalance weight 362 along an upper or opposing half of counterbalance path 363, relative to the sum of gravity 302 and platform accelerations 304).

In some embodiments, radial counterbalance mechanism 360 may include orientation sensor 574 configured to provide an orientation of counterbalance weight 362, for example, and controller 112 may be configured to receive a current orientation of counterbalance weight 362 before controlling motor 566 to position counterbalance weight 362 at the compensating radial weight position (e.g., determined in block 704). Controller 112 may then determine a rotation direction for motor 566 based, at least in part, on the current orientation and the determined compensating radial weight position. For example, controller 112 may determine a rotation direction corresponding to the minimum path distance (e.g., along counterbalance path 363) from the current orientation of counterbalance weight 362 to the orientation corresponding to the determined compensating radial weight position. In other embodiments, controller 112 may receive angular velocities of various elements of system 100, for example, and determine a rotation direction corresponding to a minimum stabilization time associated with travel along counterbalance path 363, at a rate achievable by motor 566, to the compensating radial weight position. Such rotation directions may be used to control motor 566 to position counterbalance weight 362 at the compensating radial weight position and according to the determined rotation direction.

In alternative embodiments, controller 112 may be configured to measure or otherwise characterize displacement 326 and to determine a compensating radial weight position based additionally on the characterized displacement 326, for example, or to adjust an already determined compensating radial weight position based on the characterized displacement. For example, in embodiments where payload 340 is an imaging system, controller 112 may be configured to determine a jitter amplitude and/or frequency in video imagery received from payload 340 and determine a compensating radial weight position to reduce the jitter amplitude and/or frequency, as measured in video imagery received from payload 340. In related embodiments, controller 112 may be configured to receive a vibration amplitude and/or frequency of platform 110 (e.g., from gyroscope/accelerometer 116) and compare the vibration amplitude and/or frequency to the determined jitter amplitude or frequency to determine if the jitter is caused by or roughly correlates with the vibration of platform 110, and then selectively determine a compensating radial weight position or adjust a determined compensating radial weight position to reduce the jitter when the jitter roughly correlates with the vibration of platform 110.

At block 706, a motor is controlled to position a counterbalance weight at a compensating radial weight position. For example, controller 112 may be configured to control motor 566 to position counterbalance weight 362 at the compensating radial weight position determined in block 706. In various embodiments, controller 112 may be configured to control motor 566 to rotate to an orientation, measured by orientation sensor 574, corresponding to the compensating radiation position determined in block 706 on counterbalance path 363.

By providing highly accurate, reliable, and adjustable counterbalancing of articulated payloads, embodiments of the present disclosure substantially reduce or eliminate orientation errors caused by variable loading and payload imbalances while orienting the payload. By eliminating such orientation errors, embodiments enable articulated sensor systems and targeting systems with significantly reduced jitter and/or otherwise increased range performance.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

The invention claimed is:

1. A system comprising:
a radial counterbalance mechanism comprising a counterbalance weight and a motor configured to adjust a radial position of the counterbalance weight relative to a rotational axis of a gimbal ring;
an orientation sensor configured to provide an orientation of a payload coupled to the gimbal ring, a platform coupled to the gimbal ring, and/or the gimbal ring; and
a logic device configured to communicate with the radial counterbalance mechanism and the orientation sensor, wherein the logic device is configured to:
receive the orientation of the payload, the platform, and/or the gimbal ring,
determine a compensating radial weight position for the counterbalance weight based, at least in part, on the received orientation, wherein the compensating radial weight position is configured to reduce a radial displacement of a center of gravity of the payload from the rotational axis of the gimbal ring, and
control the motor to position the counterbalance weight at the compensating radial weight position.

2. The system of claim 1, wherein:
the orientation sensor comprises a first orientation sensor;
the radial counterbalance mechanism comprises a second orientation sensor configured to provide an orientation of the counterbalance weight; and
the logic device is configured to:
receive a current orientation of the counterbalance weight before controlling the motor to position the counterbalance weight at the compensating radial weight position;
determine a rotation direction for the motor based, at least in part, on the current orientation and the compensating radial weight position; and
control the motor to position the counterbalance weight at the compensating radial weight position and according to the determined rotation direction.

3. The system of claim 1, wherein:
the radial counterbalance mechanism comprises a motor coupling configured to couple the motor to the counterbalance weight; and
the radial counter balance mechanism is coupled to the platform and/or the gimbal ring.

4. The system of claim 1, wherein:
the radial counterbalance mechanism comprises a motor coupling configured to couple the motor to the counterbalance weight; and
the motor coupling comprises a planetary gear set or a worm drive comprising a lever arm and/or a cam configured to translate rotational motion of the motor into positions of the counterbalance weight along a counterbalance path determined, at least in part, by the lever arm and/or cam; and
the compensating radial weight position lies on the counterbalance path.

5. The system of claim 1, wherein:
the radial counterbalance mechanism is configured to translate rotational motion of the motor into positions of the counterbalance weight along a planar counterbalance path; and
the planar counterbalance path lies in a plane perpendicular to the rotational axis of the gimbal ring.

6. The system of claim 5, wherein:
the planar counterbalance path comprises a circular counterbalance path.

7. The system of claim 1, wherein:
the received orientation comprises an absolute orientation of the payload and/or the gimbal ring relative to gravity; and
the logic device is configured to determine the compensating radial weight position for the counterbalance weight based, at least in part, on the absolute orientation of the payload and/or the gimbal ring.

8. The system of claim 1, wherein:
the platform comprises a mobile platform;
the received orientation comprises a first orientation of the mobile platform and a second orientation of the payload and/or the gimbal ring; and
the logic device is configured to determine the compensating radial weight position for the counterbalance weight based, at least in part, on the first orientation of the mobile platform and the second orientation of the payload and/or the gimbal ring.

9. The system of claim 8, further comprising an accelerometer configured to provide an acceleration of the mobile platform, wherein the logic device is configured to:
receive the acceleration of the mobile platform from the accelerometer; and
determine the compensating radial weight position for the counterbalance weight based, at least in part, on the first orientation of the mobile platform, the second orientation of the payload and/or the gimbal ring, and the acceleration of the mobile platform.

10. The system of claim 1, wherein the payload comprises an articulated sensor comprising an imaging module configured to provide still and/or video images along a line of sight of the payload, wherein the logic device is configured to:
receive the video images along the line of sight of the payload from the imaging module;
determine a jitter amplitude and/or frequency in the received video images; and
adjust the compensating radial weight position for the counterbalance weight to reduce the jitter amplitude and/or frequency in the received video images.

11. A method comprising:
receiving an orientation of a payload coupled to a gimbal ring, a platform coupled to the gimbal ring, and/or the gimbal ring;
determining a compensating radial weight position for a counterbalance weight of a radial counterbalance mechanism based, at least in part, on the received orientation, wherein the compensating radial weight position is configured to reduce a radial displacement of a center of gravity of the payload from a rotational axis of the gimbal ring, and
controlling a motor of the radial counterbalance mechanism to position the counterbalance weight at the compensating radial weight position.

12. The method of claim 11, wherein the radial counterbalance mechanism comprises an orientation sensor configured to provide an orientation of the counterbalance weight, the method further comprising:
receiving a current orientation of the counterbalance weight before controlling the motor to position the counterbalance weight at the compensating radial weight position;
determining a rotation direction for the motor based, at least in part, on the current orientation and the compensating radial weight position; and
controlling the motor to position the counterbalance weight at the compensating radial weight position and according to the determined rotation direction.

13. The method of claim 11, wherein:
the radial counterbalance mechanism comprises a motor coupling configured to couple the motor to the counterbalance weight; and
the radial counter balance mechanism is coupled to the platform and/or the gimbal ring.

14. The method of claim 11, wherein:
the radial counterbalance mechanism comprises a motor coupling configured to couple the motor to the counterbalance weight; and
the motor coupling comprises a planetary gear set or a worm drive comprising a lever arm and/or a cam configured to translate rotational motion of the motor into positions of the counterbalance weight along a counterbalance path determined, at least in part, by the lever arm and/or cam; and
the compensating radial weight position lies on the counterbalance path.

15. The method of claim 11, wherein:
the radial counterbalance mechanism is configured to translate rotational motion of the motor into positions of the counterbalance weight along a planar counterbalance path; and
the planar counterbalance path lies in a plane perpendicular to the rotational axis of the gimbal ring.

16. The method of claim 15, wherein:
the planar counterbalance path comprises a circular counterbalance path.

17. The method of claim 11, wherein:
the received orientation comprises an absolute orientation of the payload and/or the gimbal ring relative to gravity; and
the determining the compensating radial weight position for the counterbalance weight is based, at least in part, on the absolute orientation of the payload and/or the gimbal ring.

18. The method of claim 11, wherein:
the platform comprises a mobile platform;
the received orientation comprises a first orientation of the mobile platform and a second orientation of the payload and/or the gimbal ring; and
the determining the compensating radial weight position for the counterbalance weight is based, at least in part, on the first orientation of the mobile platform and the second orientation of the payload and/or the gimbal ring.

19. The method of claim 18, further comprising:
receiving an acceleration of the mobile platform from an accelerometer; and
determining the compensating radial weight position for the counterbalance weight based, at least in part, on the first orientation of the mobile platform, the second orientation of the payload and/or the gimbal ring, and the acceleration of the mobile platform.

20. The method of claim 11, wherein the payload comprises an articulated sensor comprising an imaging module configured to provide still and/or video images along a line of sight of the payload, the method further comprising:
receiving the video images along the line of sight of the payload from the imaging module;
determining a jitter amplitude and/or frequency in the received video images;
receiving a vibration amplitude and/or frequency of the platform from an accelerometer coupled to the platform;
determining the vibration amplitude and/or frequency correlates with the jitter amplitude and/or frequency; and
adjusting the compensating radial weight position for the counterbalance weight to reduce the jitter amplitude and/or frequency in the received video images.

* * * * *

UNITED STATES PATENT AND TRADEMARK OFFICE
CERTIFICATE OF CORRECTION

| | |
|---|---|
| PATENT NO. | : 11,015,758 B2 |
| APPLICATION NO. | : 16/240384 |
| DATED | : May 25, 2021 |
| INVENTOR(S) | : Adam C. Espersen and Charles Rush |

Page 1 of 1

It is certified that error appears in the above-identified patent and that said Letters Patent is hereby corrected as shown below:

In the Specification

In the Detailed Description:
In Column 9, Line 48, change "ebodiments" to --embodiments--.

Signed and Sealed this
Third Day of August, 2021

Drew Hirshfeld
*Performing the Functions and Duties of the*
*Under Secretary of Commerce for Intellectual Property and*
*Director of the United States Patent and Trademark Office*